United States Patent
Kyomasu et al.

[11] Patent Number: 6,135,338
[45] Date of Patent: Oct. 24, 2000

[54] CAPILLARY HOLDING STRUCTURE FOR ULTRASONIC HORN

[75] Inventors: Ryuichi Kyomasu; Minoru Kawagishi, both of Kodaira; Mitsuaki Sakakura, Iruma; Tadashi Akiike, Kokubunji, all of Japan

[73] Assignee: Kabushiki Kaisha Shinkawa, Tokyo, Japan

[21] Appl. No.: 09/169,890

[22] Filed: Oct. 12, 1998

[30] Foreign Application Priority Data

Oct. 13, 1997 [JP] Japan ................................ 9-294918

[51] Int. Cl.⁷ .................................................. B23K 20/10
[52] U.S. Cl. .............................................. 228/1.1; 228/4.5
[58] Field of Search ........................... 248/74.5, 230.1, 248/316.1, 539, 541, 67.5, 67.7, 74.2, 230.7; 403/373, 290, 256; 228/1.1, 4.5

[56] References Cited

U.S. PATENT DOCUMENTS

| | | | |
|---|---|---|---|
| 2,710,207 | 6/1955 | Mueller | 403/373 |
| 2,770,983 | 11/1956 | Hatala | 403/373 |
| 3,139,296 | 6/1964 | Greene | 403/373 |
| 3,167,292 | 1/1965 | Meyerowitz | 248/230.1 |
| 3,606,218 | 9/1971 | Enlund et al. | 403/373 |
| 4,428,697 | 1/1984 | Ruland | 403/344 |
| 5,368,216 | 11/1994 | Sakakura et al. | 228/1.1 |
| 5,667,185 | 9/1997 | Maglica | 248/541 |
| 5,851,084 | 12/1998 | Nishikawa | 403/344 |

FOREIGN PATENT DOCUMENTS

| | | |
|---|---|---|
| 5-59840 | 8/1993 | Japan . |
| 6-163648 | 6/1994 | Japan . |

*Primary Examiner*—Ramon O. Ramirez
*Attorney, Agent, or Firm*—Koda & Androlia

[57] ABSTRACT

An ultrasonic horn that has a capillary attachment hole to hold a capillary therein so as to be used in wire bonding, including a perpendicular slit provided on the opposite side of the capillary attachment hole from the tip end of the ultrasonic horn. An area surrounding the capillary attachment hole is formed thin, and the slit is narrowed and tightened by a bolt so as to insure a stable capillary holding force and prevent deterioration in the holding force over time.

6 Claims, 5 Drawing Sheets

CAPILLARY HOLDING STRUCTURE FOR ULTRASONIC HORN

BACKGROUND OF THE INVENTION

1. Field of the Invention

The present invention relates to a capillary holding structure for an ultrasonic horn used in a wire bonding apparatus.

2. Prior Art

In a wire bonding apparatus, as is universally known, an ultrasonic horn which holds a capillary at one end thereof is raised and lowered and also moved in the horizontal X and Y directions, and a wire that passes through the capillary is connected (bonded) between, for instance, the electrodes of semiconductor pellets and the lead posts of external leads.

Examples of conventional capillary holding structures for ultrasonic horns are shown in FIGS. 5 and 6; and Japanese Utility Model Application Laid-Open (Kokai) No. H5-59840 and Japanese Patent Application Laid-Open (Kokai) No. H6-163648 disclose such capillary holding structures for ultrasonic horns.

In the structure of FIG. 5, a capillary attachment hole 3 which holds a capillary 2 therein is formed in one end of an ultrasonic horn 1, and a longitudinal slit 4 is formed, as best seen from FIG. 5(A), so as to extend from the tip end (left end in FIG. 5) of the ultrasonic horn 1 and cross the capillary attachment hole 3. The capillary 2 is held in the ultrasonic horn 1 when a bolt 5 that passes through the slit 4 is tightened.

In the structure of FIG. 6, as shown in FIG. 6(B), the capillary attachment hole 3 of a constant inner diameter is not opened through the entire height of the ultrasonic horn for the constant diameter; instead, a stepped hole 3a which is for positioning the upper end of the capillary 2 is formed in the attachment hole 3. A longitudinal slit 4 is formed so as to extend from the tip end of the ultrasonic horn 1 and cross the capillary attachment hole 3, so that the area surrounding the capillary attachment hole 3 is endowed with an elastic force. Thus, the capillary 2 is held in the ultrasonic horn 1 by this elastic force alone without using a bolt. The reference numeral 6 in FIG. 6 is a threaded hole used for accomplishing a screw engagement with a bolt (not shown) that is used when replacing the capillary 2. When the bolt (not shown) is screw engaged with the threaded hole 6, the slit 4 is opened so that the capillary 2 can be released.

In either of the above structures, since the slit 4 extends from the tip end of the ultrasonic horn 1 towards the root portion thereof, the tip end part of the ultrasonic horn 1 is vertically bifurcated and has an open end 4a. As a result, when the bolt 5 is tightened down in the structure of FIG. 5, the open end 4a spreads outward, and the tightening force of the bolt 5 escapes, reducing the holding force. This would cause the capillary 2 to be unsteady or to fall out during the bonding process. On the other hand, in the structure shown in FIG. 6, the capillary 2 is held only by the elastic force of the capillary attachment hole 3, and the ultrasonic horn 1 has an open end 4a. Accordingly, there is a conspicuous deterioration in the holding force over time, and therefore a stable holding force cannot be maintained over a long period of time.

SUMMARY OF THE INVENTION

Accordingly, the object of the present invention is to provide a capillary holding structure for an ultrasonic horn which can insure a stable holding force, and in which there is no deterioration in the holding force over time.

The above object is accomplished by a unique structure of the present invention for holding a capillary for an ultrasonic horn used in a wire bonding apparatus in which a capillary is held in a capillary attachment hole formed in one end of the ultrasonic horn so that a wire passing through the capillary is connected (bonded) to, for instance, electrodes of semiconductor pellets and lead posts of external leads, wherein a perpendicular slit is formed so as to be located on the opposite side of the capillary attachment hole from the tip end of the ultrasonic horn, an area surrounding the capillary attachment hole is formed as a thin part that has a decreased thickness, and the slit is tightened by a bolt inserted into a bolt insertion hole formed so as to cross the slit.

In the above structure, one or more longitudinal relief grooves may be formed vertically in the inside wall of the capillary attachment hole.

Further, a horizontal relief groove or a horizonal relief hole may be formed in the ultrasonic horn so as to extend, at right angles to the capillary attachment hole, from the approximate center of the tip end to a point just before the bolt insertion hole.

In addition, in the present invention, the thin part has an elastic force, and the ultrasonic horn is preferably made of a titanium material.

BRIEF DESCRIPTION OF THE DRAWINGS

FIG. 2 shows the tip end of the ultrasonic horn shown in FIG. 1 in which FIG. 3 shows the tip end of the ultrasonic horn of the second embodiment of the present invention, in which

FIG. 4 shows the tip end of the ultrasonic horn of the third embodiment of the present invention, in which

FIG. 5 illustrates one example of the tip end of a conventional ultrasonic horn, in which FIG. 5(A) is a plan view thereof, and FIG. 5(B) is a side view thereof; and FIG. 6 illustrates another example of the tip end of a conventional ultrasonic horn, in which FIG. 6(A) is a plan view thereof, and FIG. 6(B) is a side view thereof.

DETAILED DESCRIPTION OF THE INVENTION

Figure 1:
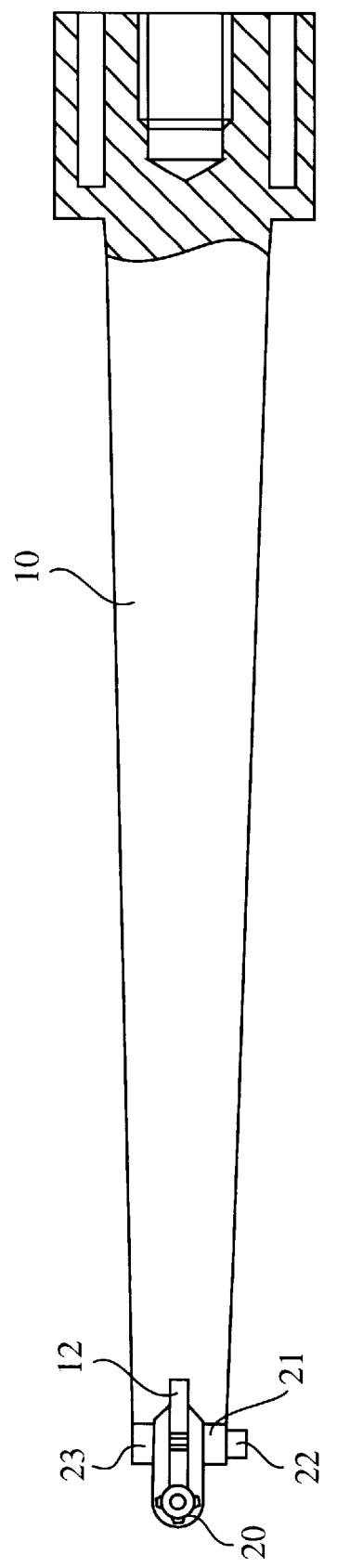
FIG. 1 is a plan view of the ultrasonic horn according to one embodiment of the present invention.

The first embodiment of the present invention will be described with reference to FIGS. 1 and 2.

An ultrasonic horn 10 is formed at one end (tip end) thereof with a capillary attachment hole 11 which is for holding a capillary 20. A slit 12 is formed perpendicularly in the ultrasonic horn 10 and extends in the lengthwise direction of the horn 10. As best seen from FIG. 2(A), the slit 12 is provided on the opposite side (on the right side in the drawing) of the capillary attachment hole 11 from the tip end of the ultrasonic horn 10. The area surrounding the capillary attachment hole 11 is formed thin to make a thin part 13 and to provide elasticity. In addition, three longitudinal relief grooves 14 are formed vertically in the inside wall of the capillary attachment hole 11.

Furthermore, a bolt insertion hole 15 is provided so as to open from one side surface to another side surface of the ultrasonic horn 10 so as to horizontally pass through the ultrasonic horn 10 and cross the slit 12. A tightening bolt 22 is inserted into the bolt insertion hole 15 from one side of the ultrasonic horn 10 with a washer 21 in between, and a nut 23 which is disposed on the other side of the horn 10 is screwed to the tip end of the tightening bolt 22.

Figure 2A:
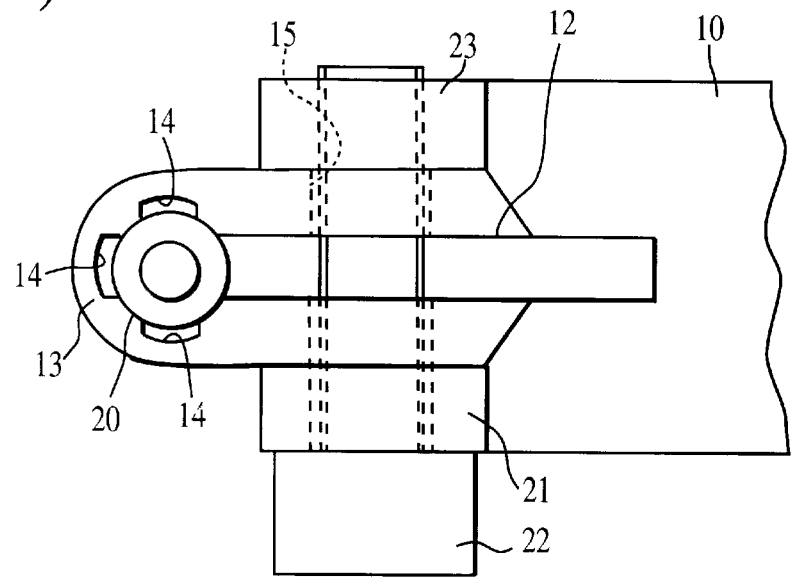
FIG. 2(A) is an enlarged plan view thereof.
Figure 2B:
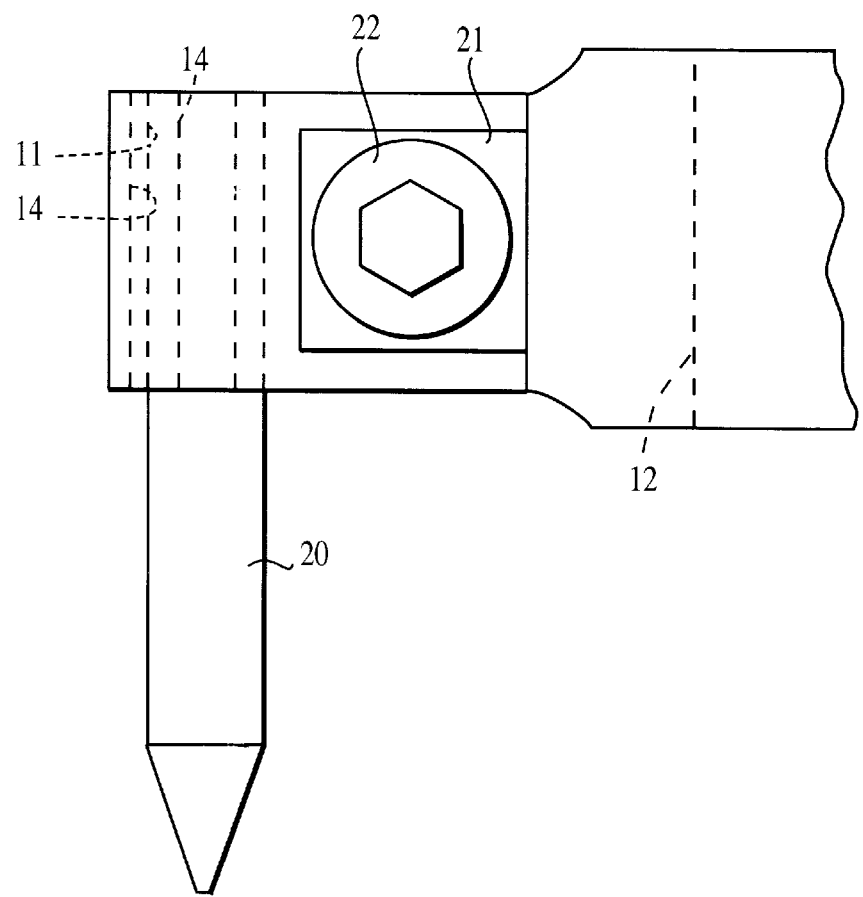
FIG. 2(B) is an enlarged side view thereof.

With the structure above, the capillary 20 is attached to the ultrasonic horn 10 by, as best seen from FIG. 2(B), inserting the capillary 20 into the capillary attachment hole II and the tightening bolt 22 in the bolt insertion hole 15, and then tightening the bolt 22 with the nut 23 mounted thereon as seen from FIG. 2(A). When the bolt 22 is tightened down with the nut 23 thereon, the slit 12 bends inward or the width thereof narrows, and the tightening force is applied to the thin part 13 without escaping, so that the thin part 13 undergoes elastic deformation, causing the contraction of the capillary attachment hole 11 by an appropriate force. As a result, the capillary 20 is held by the ultrasonic horn 10.

During the holding, a stable holding force can be insured, and no deterioration in this holding force occurs over time. Furthermore, since a plurality of longitudinal relief grooves 14 are formed inside the capillary attachment hole 11, the thin part 13 can fit on the capillary 20 more snugly. Thus, a desirable capillary holding arrangement can be obtained. It is also possible to form just a single longitudinal relief groove 14.

FIG. 3 illustrates a second embodiment of the present invention.

Figure 3A:
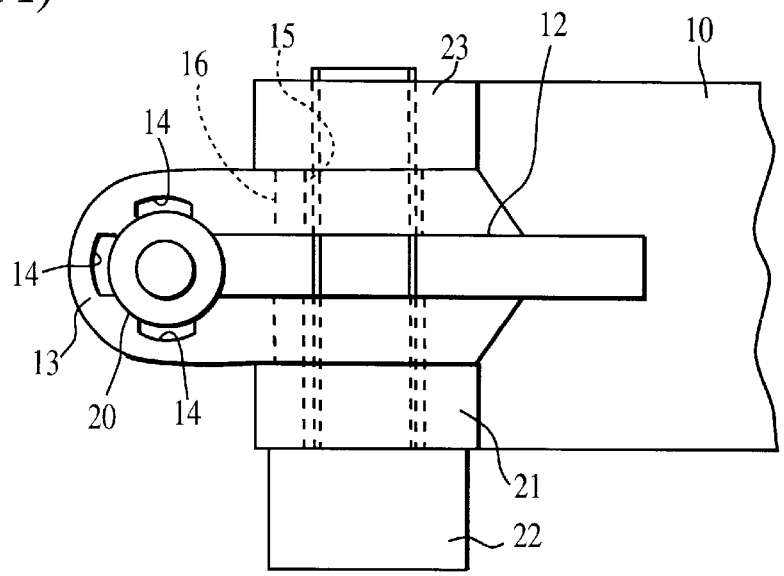
FIG. 3(A) is an enlarged plan view thereof.
Figure 3B:
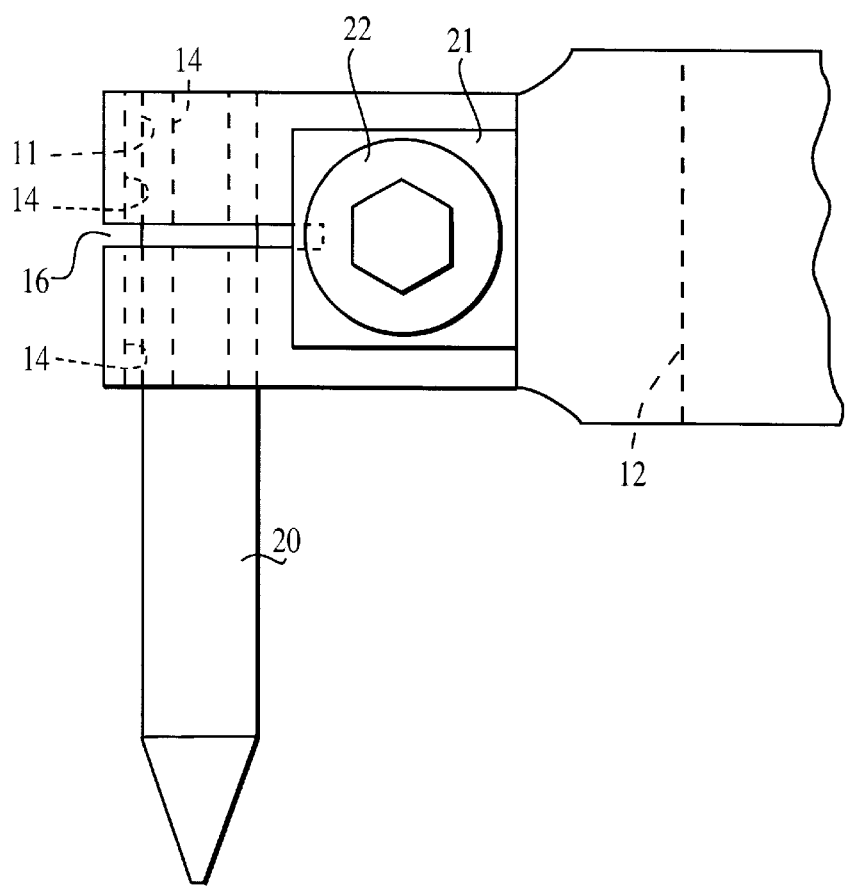
FIG. 3(B) is an enlarged side view thereof.

In this embodiment, a horizontal relief groove 16 is formed so that the relief groove 16 extends, as best seen from FIG. 3(B), at right angles to the axis of the capillary attachment hole 11 from the approximate center of the tip end of the ultrasonic horn 10 to a point just before the bolt insertion hole 15. In all other respects, the construction of the second embodiment is the same as that of the first embodiment.

With this horizontal relief groove 16, the capillary 20 can be held by the upper and lower portions of the capillary attachment hole 11, so that the holding of the capillary 20 becomes even more stable.

Figure 4A:
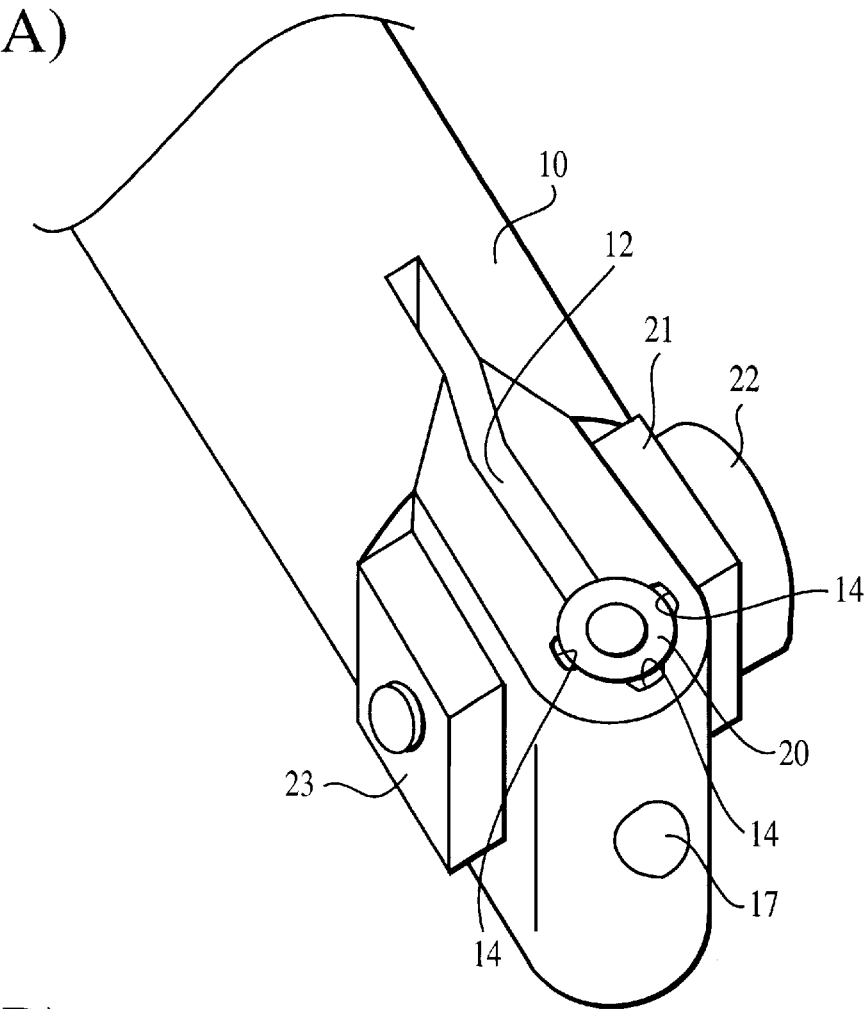
FIG. 4(A) is an enlarged perspective view thereof.

FIG. 4 illustrates a third embodiment of the present invention.

Figure 4B:
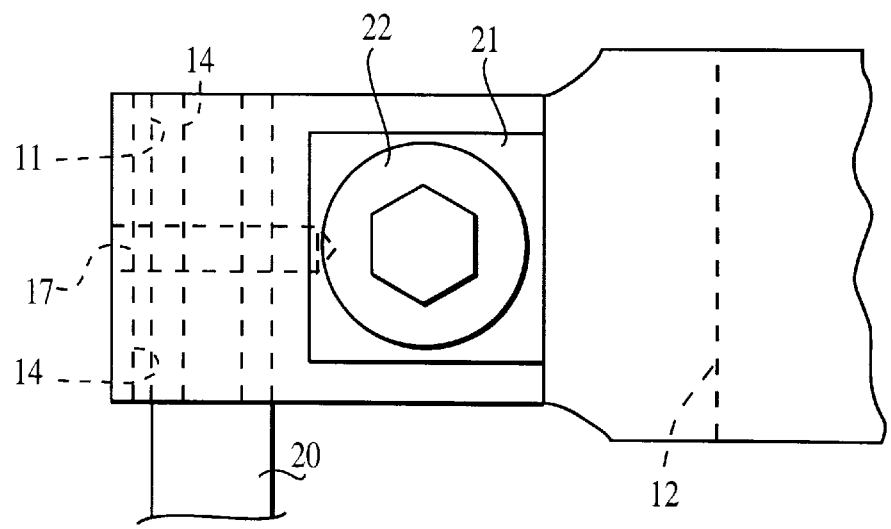
FIG. 4(B) is an enlarged side view thereof.
Figure 5:
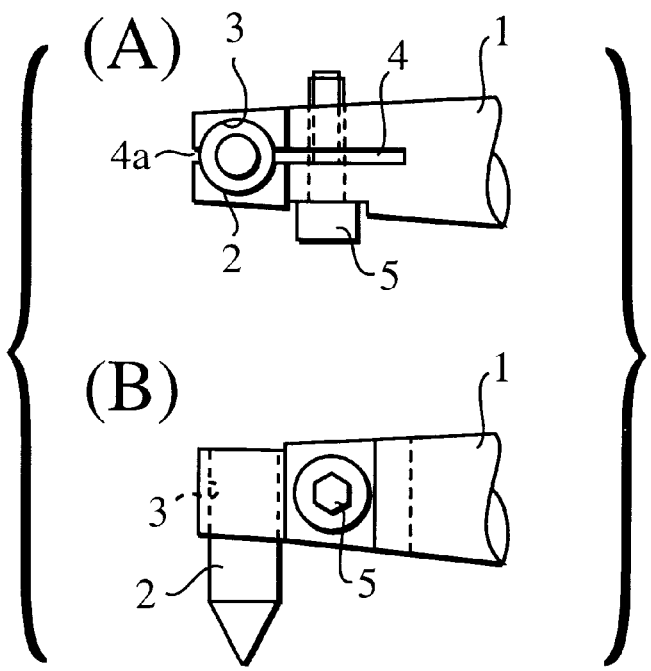
Figure 6:
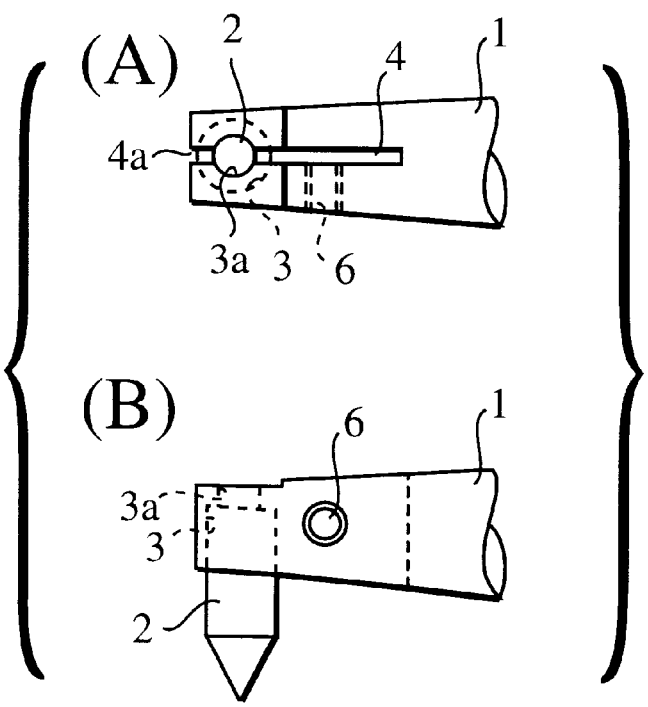

In this embodiment, a horizontal relief hole 17 is formed so that the relief hole 17 extends, as best seen from FIG. 4(B), at right angles to the axis of the capillary attachment hole 11 from the approximate center of the tip end of the ultrasonic horn 10 to a point just before the bolt insertion hole (see FIG. 3(A) for the bolt insertion hole 15). Since this third embodiment has the substantially the same structure as the second embodiment except for the relief hole 17, substantially the same effect as that of the third embodiment can be obtained with this fourth embodiment that includes the horizontal relief hole 17 which is provided instead of the horizontal relief groove 16 used in the third embodiment.

In each of the embodiments above, the bolt insertion hole 15 is formed horizontally in the ultrasonic horn 10, and the capillary is held by the bolt 22 and nut 23. However, it is also possible to simply form a bolt insertion hole on one side of the slit 12 and a threaded hole on the other side so that a bolt is directly screwed into this threaded hole (without using a nut).

In addition, the ultrasonic horn 10 can be made from a titanium material. Since the amount of thermal expansion of a titanium material is small (e.g., approximately 60% smaller than that of stainless steel), with the use of a titanium ultrasonic horn, the bolt 22 is less likely to be loosened, the holding force of the capillary 20 is more stable, and the overall weight can be reduced. Thus, the use of the titanium material is desirable. In addition, with the use of a titanium ultrasonic horn, positional discrepancies in the bonding position can be avoided.

As seen from the above, according to the present invention, a perpendicular slit is formed so as to be located on the opposite side of a capillary attachment hole from the tip end of the ultrasonic horn, and the area surrounding the capillary attachment hole is formed thin; and upon use, the slit is narrowed by a tightening bolt. Accordingly, a stable holding force for a capillary can be insured, and there is no deterioration in the holding force over time.

What is claimed is:

1. A capillary holding structure in combination with an ultrasonic horn used in a wire bonding apparatus in which a capillary is held in a capillary attachment hole formed in a tip end of said ultrasonic horn so that a wire passing through said capillary is connected to a plurality of bonding points, said holding structure comprising a perpendicular slit formed on an opposite side of said capillary attachment hole from said tip end of said ultrasonic horn and extending from said attachment hole in a direction away from said tip end, a portion completely surrounding said capillary attachment hole adjacent said tip end through which said perpendicular slit does not extend said portion being decreased in thickness so as to form a thin part relief means on said capillary attachment hole, and a bolt inserted into a bolt insertion hole formed so as to cross said perpendicular slit for tightening said perpendicular slit.

2. A capillary holding structure according to claim 1, wherein said relief means comprises at least one longitudinal relief groove is formed vertically in an inside wall of said capillary attachment hole.

3. A capillary holding structure according to claim 1, wherein a horizontal relief groove is formed in said ultrasonic horn so as to extend, at right angles to said capillary attachment hole, from an approximate center of tip end of said ultrasonic horn to a point before said bolt insertion hole.

4. A capillary holding structure according to claim 1, wherein a horizontal relief hole is formed in said ultrasonic horn so as to extend, at right angles to said capillary attachment hole, from an approximate center of tip end of said ultrasonic horn to a point before said bolt insertion hole.

5. A capillary holding structure according to claim 1, wherein said thin part has an elastic force.

6. A capillary holding structure according to any one of claims 1 through 4, wherein said ultrasonic horn is made of a titanium material.

* * * * *